United States Patent
Kondo et al.

(10) Patent No.: US 6,653,165 B2
(45) Date of Patent: Nov. 25, 2003

(54) METHODS OF FORMING SEMICONDUCTOR ELEMENT, AND SEMICONDUCTOR ELEMENTS

(75) Inventors: Takaharu Kondo, Kyoto (JP); Masafumi Sano, Kyoto (JP); Akira Sakai, Kyoto (JP); Koichi Matsuda, Kyoto (JP); Yuzo Koda, Kyoto (JP); Tadashi Hori, Nara (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/058,322

(22) Filed: Jan. 30, 2002

(65) Prior Publication Data
US 2002/0168794 A1 Nov. 14, 2002

(30) Foreign Application Priority Data
Jan. 31, 2001 (JP) .................................. 2001-024169
Jan. 28, 2002 (JP) .................................. 2002-018443

(51) Int. Cl.[7] .............................................. H01L 21/00
(52) U.S. Cl. ............................. 438/73; 438/74; 438/488
(58) Field of Search ..................... 438/488, 57, 73, 438/74, 96, 97, 98, 479, 489, 482; 136/258

(56) References Cited

U.S. PATENT DOCUMENTS

| 4,400,409 A | 8/1983 | Izu et al. .................. 427/39 |
| 5,600,152 A | 2/1997 | Kozuka et al. ............... 257/55 |
| 6,190,932 B1 * | 2/2001 | Yoshimi et al. |
| 6,261,862 B1 | 7/2001 | Hori et al. .................. 438/96 |
| 2001/0023971 A1 * | 9/2001 | Kondo et al. ................ 438/458 |
| 2002/0059726 A1 * | 5/2002 | Sawada et al. |

FOREIGN PATENT DOCUMENTS

| JP | 7-335935 | 12/1995 |
| JP | 11-103082 | 4/1999 |
| JP | 11-150282 | 6/1999 |
| JP | 11-186574 | 7/1999 |
| JP | 2000-138384 | 5/2000 |
| JP | 2000-252496 | 9/2000 |

* cited by examiner

*Primary Examiner*—Savitri Mulpuri
(74) *Attorney, Agent, or Firm*—Fitzpatrick, Cella, Harper & Scinto

(57) ABSTRACT

For efficiently forming a semiconductor element with excellent adhesion and environment resistance, a semiconductor element forming method is configured to have a step of forming a plurality of pin junctions of a silicon-based material on a substrate by a high-frequency plasma CVD process under a pressure of not more than atmospheric pressure, and the method further has a step of forming a p-layer, an i-layer, and a portion of an n-layer of a first pin junction of the pin junctions or forming an n-layer, an i-layer, and a portion of a p-layer of a first pin junction of the pin junctions, and thereafter exposing the p-layer or the n-layer exposed in the surface, to an oxygen-containing atmosphere; a step of forming on the p-layer or the n-layer as exposed to the oxygen-containing atmosphere a layer of the same conductivity type as that of the p-layer or the n-layer; and a step of forming an n-layer or a p-layer of a second pin junction adjacent to the first pin junction to form a pn interface.

20 Claims, 7 Drawing Sheets

METHODS OF FORMING SEMICONDUCTOR ELEMENT, AND SEMICONDUCTOR ELEMENTS

BACKGROUND OF THE INVENTION

1. Field of the Invention

The present invention relates to methods of forming a semiconductor element, and semiconductor elements. The semiconductor element forming methods of the present invention are suitably applicable, particularly, as methods of forming photoelectric conversion elements such as solar cells and the like.

2. Related Background Art

High-frequency plasma CVD processes have the advantages of facilitating increase of area and formation at low temperatures and increasing process throughput and are thus one of predominant means as methods of forming silicon-based thin films.

Let us consider solar cells as an example of semiconductor elements having a semiconductor junction consisting of silicon-based thin films. As compared with existing energy utilizing fossil fuels, the solar cells using the silicon-based thin films have the advantages of inexhaustible energy sources and clean power generation processes, but it is necessary to further decrease the unit cost per generated power, in order to make them widespread. Technological subjects significant for that purpose involve establishment of production techniques for implementing lower cost, establishment of techniques for increasing the photoelectric conversion efficiency, establishment of techniques concerning evenness for forming semiconductor elements with desired characteristics on a stable basis, and establishment of techniques for enhancing the environment resistance in consideration of practical operating conditions that the solar cells are often installed outdoors.

The known methods of producing the semiconductor elements having the semiconductor junction consisting of the silicon-based thin films include a method of sequentially forming semiconductor layers of desired conductivity types in a single semiconductor forming chamber, a method called a batch type in which a p-layer, an i-layer, and an n-layer are formed in their respective, independent semiconductor forming chambers, so as to be capable of preventing mixture of impurity gas, and so on.

As a method of preventing the mixture of impurity and substantiating much lower cost, U.S. Pat. No. 4,400,409 discloses the continuous plasma CVD process employing the Roll to Roll system. In this method, a substrate is conveyed so as to pass through a plurality of glow discharge regions, which are installed through gas gates mounted in between to prevent incorporation of an impurity gas, whereby semiconductor layers of desired conductivity types can be sequentially formed. The Roll to Roll system involves a step of conveying the substrate while unwinding the substrate from a roll and winding up the substrate onto another roll.

The high-frequency plasma CVD processes having been proposed heretofore are excellent as semiconductor element forming methods, but the number of necessary semiconductor forming chambers increases where the semiconductor element includes a plurality of pin junctions or where the p-layer, the i-layer, and/or the n-layer is of a multilayer structure. Let us suppose herein that in the semiconductor element forming steps, all the semiconductor forming chambers are coupled through a gas gate or directly so as to form the semiconductor layers continuously. In this configuration, the entire system has to be stopped every time part of the semiconductor forming chambers require maintenance, inspection, repair, and so on. In the forming method including continuous discharge over long periods, there occurs time dependence of characteristics due to change in heat or degassing amount or the like during the long-period discharge, which will result in posing the problem of causing dispersion in the characteristics of the semiconductor element.

SUMMARY OF THE INVENTION

An object of the present invention is to provide a semiconductor element forming method capable of efficiently forming a semiconductor element having a stack configuration of a number of silicon-based thin films, and a method of forming a semiconductor element with better evenness and characteristics, and also provide semiconductor elements with excellent adhesion, environment resistance, and so on.

The present invention provides a method of forming a semiconductor element comprising a step of forming a plurality of pin junctions comprised of a silicon-based material on a substrate by a high-frequency plasma CVD process under a pressure of not more than atmospheric pressure, the method comprising a step of forming a p-layer (p-type semiconductor layer), an i-layer (i-type semiconductor layer), and a portion of an n-layer (n-type semiconductor layer) of a first pin junction of the pin junctions or forming an n-layer, an i-layer, and a portion of a p-layer of a first pin junction of the pin junctions, and thereafter exposing the p-layer or the n-layer exposed in the surface, to an oxygen-containing atmosphere; a step of forming on the p-layer or the n-layer as exposed to the oxygen-containing atmosphere a layer of the same conductivity type as that of the p-layer or the n-layer, thereby completing the first pin junction; and a step of forming an n-layer or a p-layer of a second pin junction adjacent to the first pin junction to form a pn interface.

In a preferred embodiment of the present invention, during formation of a layer (a p-layer or an n-layer) formed last of a certain pin junction, the layer (the p-layer or the n-layer) being formed is exposed to an oxygen-containing atmosphere, thereafter a p-layer or an n-layer (a layer of the same conductivity type as that of the layer having been exposed to the oxygen atmosphere) is again formed on the p-layer or the n-layer having been exposed to the oxygen-containing atmosphere to complete one pin junction, and then a layer (an n-layer or a p-layer: a layer of a conductivity type opposite to that of the layer having been exposed to the oxygen atmosphere) to be first formed in an adjacent pin junction is formed.

More specific methods of the present invention include (1) a semiconductor element forming method comprising a step of forming a p-type layer, a step of forming an i-type layer thereon, a step of forming an n-type layer thereon, a step of exposing the n-type layer to an oxygen atmosphere, a step of forming an n-type layer on the n-type layer having been exposed to the oxygen atmosphere (these steps heretofore form a first pin junction), and a step of sequentially forming a p-type layer, an i-type layer, and an n-type layer on the n-type layer; (2) a semiconductor element forming method comprising a step of forming an n-type layer, a step of forming an i-type layer thereon, a step of forming a p-type layer thereon, a step of exposing the p-type layer to an oxygen atmosphere, a step of forming a p-type layer on the p-type layer having been exposed to the oxygen atmosphere (these steps heretofore form a first pin junction), and a step of sequentially forming an n-type layer, an i-type layer, and a p-type layer on the said p-type layer; and so on.

In the present invention, a dopant concentration of the n-layer or the p-layer formed immediately before the step of exposure to the oxygen-containing atmosphere is preferably made smaller than a dopant concentration of the n-layer or the p-layer formed immediately after the step of exposure to the oxygen-containing atmosphere.

In the present invention, a partial pressure of oxygen in the oxygen-containing atmosphere is preferably not less than 1 Pa. The oxygen-containing atmosphere may be the atmosphere.

In the present invention, it is preferable that the i-layer of one of the first pin junction and the second pin junction is amorphous and the i-layer of the other one comprises a crystal phase. A preferred example of this embodiment is a method wherein, at a stage when a portion of a layer to be formed last (a p-layer or an n-layer) of a pin junction having an amorphous i-layer is formed, it (the layer being formed) is exposed to an oxygen-containing atmosphere and thereafter a p-layer or a n-layer (a layer of the same conductivity type as that of the layer having been exposed to the oxygen atmosphere) is formed on the p-layer or the n-layer having been exposed to the oxygen-containing atmosphere, to complete the layer being formed, thereby forming a first pin junction and wherein thereafter a layer to be formed first (an n-layer or a p-layer: a layer of a conductivity type opposite to that of the layer having been exposed to the oxygen atmosphere) of an adjacent pin junction (in which the i-layer is a crystalline layer such as a microcrystalline layer, a polycrystalline layer, or the like, or a layer comprising a crystal phase) is formed. Conversely, another preferred example is a method wherein, at a stage when a portion of a layer to be formed last (a p-layer or an n-layer) of a pin junction having a crystalline i-layer of microcrystals, polycrystals, or the like, or an i-layer comprising a crystal phase is formed, it (the layer being formed) is exposed to an oxygen-containing atmosphere and thereafter a p-layer or an n-layer (a layer of the same conductivity type as that of the layer having been exposed to the oxygen atmosphere) is formed on the p-layer or the n-layer having been exposed to the oxygen-containing atmosphere, to complete the layer being formed, thereby forming a first pin junction and wherein thereafter a layer to be formed first (an n-layer or a p-layer: a layer of a conductivity type opposite to that of the layer having been exposed to the oxygen atmosphere) of an adjacent pin junction (in which the i-layer is an amorphous layer) is formed.

In the present invention, preferably, a step of heating, cooling, and heating is carried out at least once after the step of exposure to the oxygen-containing atmosphere and thereafter the p-layer or the n-layer (the layer of the same conductivity type as that of the layer having been exposed to the oxygen atmosphere) is again formed to complete the first pin junction. A preferred example of this embodiment is a method of heating, cooling, and again heating the substrate and the deposited semiconductor layers having been exposed to the oxygen-containing atmosphere. A simple means for such heating and cooling is provision of a heater on the opposite side of the substrate to the semiconductor layers. It can also serve as a cooling means when the temperature of the heater is low. The cooling may be self-cooling. The step of heating, cooling, and heating is preferably carried out in a hydrogen atmosphere.

A preferred embodiment of the present invention is one using the plasma CVD process of the Roll to Roll system. A preferred example thereof is a method comprising a step of, while forming the first pin junction by the high-frequency plasma CVD process, conveying the substrate by the Roll to Roll system and winding up the substrate onto a roll; a step of exposing the substrate in a wound state on the roll to the oxygen-containing atmosphere; and a step of, while unwinding the substrate from the roll by the Roll to Roll system, conveying the substrate, forming the layer of the same conductivity type as that of the p-layer or the n-type layer, on the p-layer or the n-layer having been exposed to the oxygen-containing atmosphere, by the high-frequency plasma CVD process to complete the first pin junction, and thereafter forming the second pin junction. In use of the Roll to Roll system, the foregoing heating, cooling, and heating steps are preferably carried out by conveying the substrate through an interior of a space with temperature differences (e.g., an interior of a space provided in part with heaters).

In the present invention, preferably, different tensile stresses are exerted on the substrate between before and after the step of exposure to the oxygen-containing atmosphere. More specifically, the tensile stress exerted on the substrate before the step of exposure to the oxygen-containing atmosphere is preferably greater than the tensile stress exerted on the substrate after the step of exposure to the oxygen-containing atmosphere.

A specific means for varying the tensile stress in this way is a means of exposing the substrate as wound on the roll to the oxygen-containing atmosphere and changing the tensile stress exerted on the substrate from one to the other between the conveying steps by the Roll to Roll system before and after the exposing step.

In the present invention, the method preferably comprises a process of decreasing the tensile stress during the step of conveying the substrate by the Roll to Roll system. More specifically, at least one of the tensile stresses exerted on the substrate before and after the step of exposure to the oxygen-containing atmosphere is decreased during the step of conveying the substrate.

The present invention also provides a method of forming a semiconductor element comprising a step of forming a pin junction comprised of a silicon-based material on a substrate by a high-frequency plasma CVD process, the method comprising a step of forming a portion of a p-layer or a portion of an n-layer of the pin junction and thereafter exposing the p-layer or the n-layer exposed in a surface, to an oxygen-containing atmosphere; and a step of forming on the p-layer or the n-layer as exposed to the oxygen-containing atmosphere a layer of the same conductivity type as that of the p-layer or the n-layer. In this case, the aforementioned, preferred embodiments can also be suitably applied as occasion may demand.

For example, preferably, a dopant concentration of the p-layer or the n-layer formed immediately before the step of exposure to the oxygen-containing atmosphere is made different from a dopant concentration of the p-layer or the n-layer formed immediately after the step of exposure to the oxygen-containing atmosphere, and among the dopant concentrations of the respective layers, the dopant concentration of the p-layer or the n-layer closer to the i-layer is made smaller than the dopant concentration of the p-layer or the n-layer more distant from the i-layer. By this, when the p-layer (or the n-layer) is considered in the divided form with the interface exposed to the oxygen-containing atmosphere being a boundary plane, it becomes feasible to suppress diffusion of the dopant into the i-layer when the dopant concentration of the layer closer to the i-layer adjacent thereto is made smaller.

Another specific preferred example is a method comprising a step of, while forming at least a portion of the pin junction by the high-frequency plasma CVD process, conveying the substrate by the Roll to Roll system and wind up the substrate onto a roll; a step of exposing the substrate as wound on the roll to the oxygen-containing atmosphere; and a step of, while unwinding the substrate from the roll by the Roll to Roll system, conveying the substrate and forming a layer of the same conductivity type as that of the p-layer or the n-layer, on the p-layer or the n-layer having been exposed to the oxygen-containing atmosphere, by the high-frequency plasma CVD process.

The present invention also provides a method of forming a semiconductor element comprising a step of forming a plurality of pin junctions comprised of a silicon-based material on a substrate by a high-frequency plasma CVD process under a pressure of not more than atmospheric pressure, the method comprising the steps of:

forming a first pin junction of the pin junctions;

forming a portion of an n-layer or a portion of a p-layer of a second pin junction adjacent to the first pin junction to form a pn interface;

exposing the p-layer or the n-layer exposed in a surface, to an oxygen-containing atmosphere; and forming on the p-layer or the n-layer as exposed to the oxygen-containing atmosphere a layer of the same conductivity type as that of the p-layer or the n-layer.

The present invention further provides semiconductor elements formed by the above-stated methods.

In the present specification, there are cases employing a description style wherein the whole of the layer exposed to the oxygen atmosphere during the formation is described as one layer (n-layer or p-layer) and cases employing a description style wherein the layer formed before the exposure to the oxygen atmosphere and the layer formed after the exposure to the oxygen atmosphere are described as separate layers. However, they are only different in the description styles for convenience' sake, and there is no substantial difference between the cases in one description style and the cases in the other description style.

DESCRIPTION OF THE PREFERRED EMBODIMENTS

Figure 1:
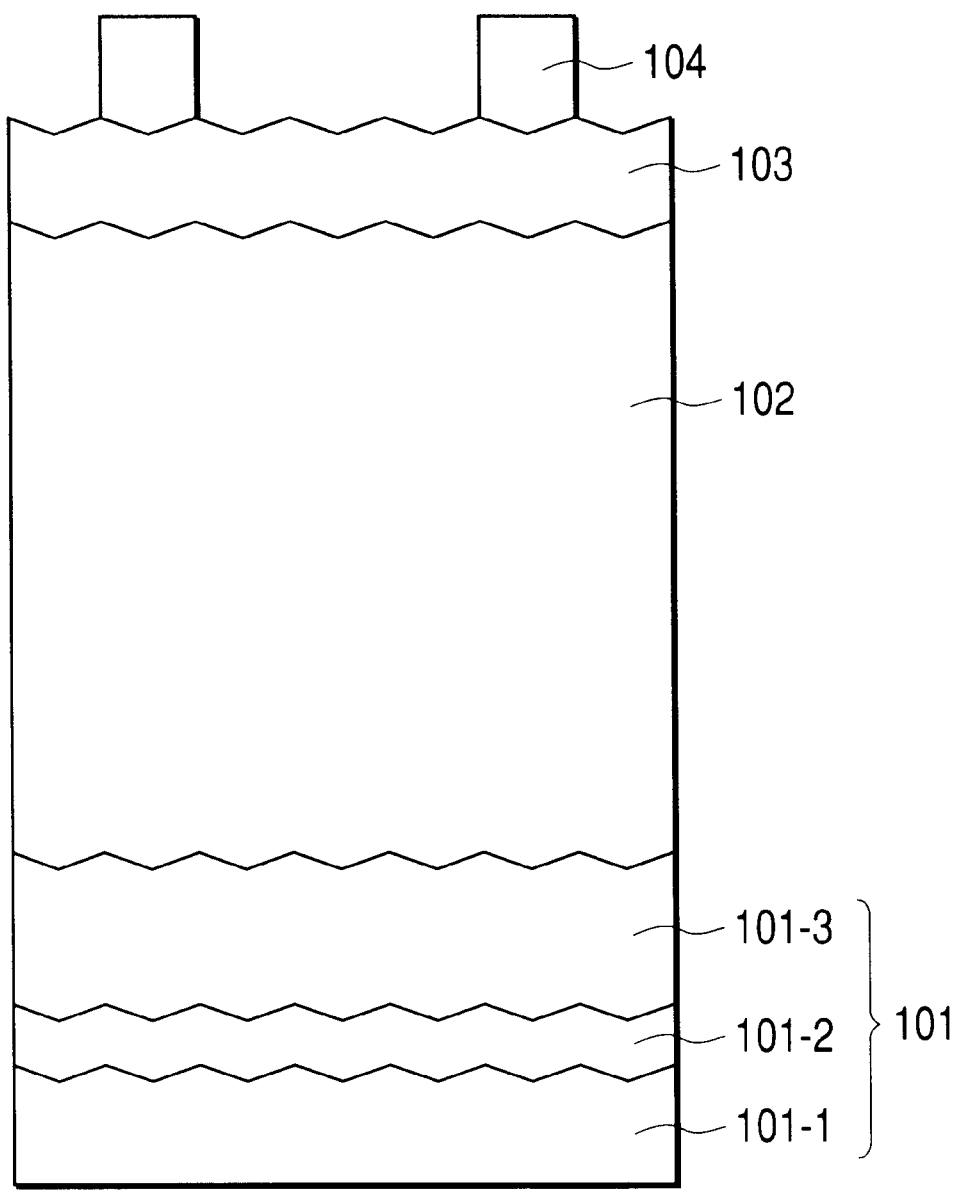
FIG. 1 is a schematic, cross-sectional view showing an example of a photovoltaic element including a semiconductor element of the present invention.

The inventor has conducted elaborate research in order to solve the aforementioned problems and found that the semiconductor element forming methods provided by the present invention were able to efficiently form the semiconductor element having the stack configuration of a number of silicon-based thin films, to form the semiconductor element with better evenness and characteristics, and to form the semiconductor element with excellent adhesion, environment resistance, and so on.

The following action is yielded by employing the aforementioned configurations.

In the semiconductor element having a plurality of pin junctions, a pn interface is formed in each region where two pin junctions abut on each other. In the region where the pn interface is formed, the dopants in the p-type and n-type semiconductor layers diffuse to lower the effective dopant concentrations, thereby degrading the function as conductive layers. In order to prevent it and maintain the sufficient function as the conductive layers even with occurrence of the diffusion of the dopants, employed is a means for making the dopant concentration of at least one of the p-type semiconductor layer and the n-type semiconductor layer higher than the concentration needed in a single pin junction. This is effective to some extent in that the effective dopant concentration is maintained, but it induces diffusion of dopant atoms toward the i-type semiconductor side to become a factor of causing degradation of characteristics of the semiconductor element on the other hand.

By forming the p-layer, the i-layer, and a portion of the n-layer of a first pin junction or forming the n-layer, the i-layer, and a portion of the p-layer of a first pin junction, thereafter exposing the p-layer or the n-layer exposed in the surface, to the oxygen-containing atmosphere, and forming the layer of the same conductivity type as that of the p-layer or the n-layer, on the p-layer or the n-layer having been exposed to the oxygen-containing atmosphere, an oxygen-containing layer such as an oxygen atom layer, an oxide layer or the like of a minute thickness is formed inside the p-layer or the n-layer of the first pin junction. Since the oxygen-containing layer can restrain the diffusion of the dopant into the i-type semiconductor layer of the first pin junction even with the increase of the dopant concentration of the dopant in the p-layer or the n-layer (the layer adjacent to the interface of the pn junction) formed on the p-layer or the n-layer having been exposed to the oxygen-containing atmosphere, the aforementioned problem is overcome. This effect also appears similarly in the case where the oxygen-containing layer is provided in side the p-layer or the n-layer to be formed before the formation of the i-layer. The formation of the oxygen-containing layer inside such layer is preferable, because it can make the band gap wider and suppress absorption of incident light. Further, since the oxygen-containing layer has the effect of scattering the incident light, it is expected to lengthen the traveling paths of the incident light in the i-type layer functioning as a light absorbing layer and thus increase the quantity of absorption of the incident light.

Examples of timing suitable for the exposure to the oxygen-containing atmosphere are as follows: when the n-layer, the i-layer, and the p-layer are formed in the named order, in the case of semiconductor elements having one pin junction, formation of nip/exposure to oxygen-containing atmosphere/formation of p; in the case of semiconductor elements having two pin junctions, formation of nip/exposure to oxygen-containing atmosphere/formation of pnip, formation of nipn/exposure to oxygen-containing atmosphere/formation of nip, and formation of nipnip/exposure to oxygen-containing atmosphere/formation p; in the case of semiconductor elements having three pin junctions, formation of nip/exposure to oxygen-containing atmosphere/formation of pnipnip, formation of nipnip/exposure to oxygen-containing atmosphere/formation of pnip, and formation of nip/exposure to oxygen-containing atmosphere/formation of pnip/exposure to oxygen-containing atmosphere/formation of pnip. The same consideration also applies similarly to the case of semiconductor elements having four or more pin junctions. Each pin junction is not limited to only the configuration in which the n-layer, the i-layer, and the p-layer are formed in the named order as described above, but also embraces the configuration in which the p-layer, the i-layer, and the n-layer are formed in the named order. The above-mentioned examples of timing for the exposure to an oxygen-containing atmosphere also applies to the reverse order configuration with the layer order being changed reversedly. Further, it is also preferable to expose both the p-layer and the n-layer adjacent to the pn interface to the oxygen-containing atmosphere during the formation thereof, more specifically, to employ a configuration of formation of nip/exposure to oxygen-containing atmosphere/formation of pn/exposure to oxygen-containing atmosphere/formation of nip or a configuration of formation of pin/exposure to oxygen-containing atmosphere/formation of np/exposure to oxygen-containing atmosphere/formation of pin, in terms of the suppression of the diffusion of dopants. From the viewpoint of the aforementioned effect of suppressing the absorption of the incident light, it is preferable to expose the p-layer or the n-layer on the light incidence side with respect to the i-layer, to the oxygen-containing atmosphere during the formation thereof.

Here the oxygen-containing atmosphere is desirably one in which the partial pressure of oxygen is not less than 1 Pa. This permits the minute thickness oxygen-containing layer to be formed uniformly. Further, the step of exposure to the oxygen-containing atmosphere is preferably exposure to the atmosphere, because it permits faster formation of the oxygen-containing layer and is an easy method.

The step of exposure to the oxygen-containing atmosphere is preferably not a step of revealing the atom implantation effect like plasma processing, but a step of exposing the layer to the oxygen-containing atmosphere causing no change in the underlying silicon structure.

Excess oxygen atoms adsorb to the surface of the semiconductor layer in the exposure to the oxygen-containing atmosphere, and in the case of the exposure to the atmosphere, gas, water, etc. in the atmosphere adsorbs to the surface of the semiconductor layer. The adsorbates can be effectively removed by placing the semiconductor layer under a negative pressure environment or passing it through the step of heating, cooling, and heating during the formation of the semiconductor layer after the exposure to the oxygen-containing atmosphere. In this case, at least the first heating is preferably carried out under an atmosphere different from the semiconductor forming atmosphere in order to avoid mixture of desorbing substances into the semiconductor layer. Specifically, it is preferable to perform heating under a certain atmosphere to desorb unwanted substances from the surface, thereafter perform the conveying step and the cooling step under another atmosphere separated through a gate or a gas gate, and then perform heating again in the semiconductor forming atmosphere to form the semiconductor layer. Preferred heating means include a method of indirectly heating the substrate with a sheath heater or a lamp heater, a method of heating the substrate in direct contact with a heater block incorporating the sheath heater or the lamp heater, and so on. Preferred cooling methods include a method using a cooling pipe through which a liquid or a gas circulates, a method of delivering a spray of cooling gas, and so on. It is also possible to employ cooling with a heater at low temperatures, self-cooling, and cooling with a spray of such gas as hydrogen or the like.

It is preferable to carry out the heating, cooling, and heating step in a hydrogen atmosphere, because the semiconductor surface is cleaned, the surface of the semiconductor layer is covered with hydrogen atoms to passivate the surface of the semiconductor layer, thereby improving the film quality, and adhesion is improved to the layers formed before and after the step of exposure to the oxygen-containing atmosphere.

In the formation of the semiconductor element by the high-frequency plasma CVD process, where the semiconductor element includes a plurality of pin junctions or where the p-layer, the i-layer, and/or the n-layer is of the multilayer structure, the number of necessary semiconductor forming chambers will increase if the semiconductor layers are formed in their respective semiconductor forming chambers different from each other. In the semiconductor element forming steps herein, where all the semiconductor forming chambers are continuously coupled to form the semiconductor layers continuously, the entire system has to be stopped every time part of the semiconductor forming chambers require maintenance, inspection, repair, and so on. The frequency of necessary maintenance is generally different among these semiconductor forming chambers. Among the layers making the semiconductor element, a higher film forming rate is necessary in the step of forming a layer with a larger film thickness. Conditions of higher film forming rates relatively increase deposition of film onto the interior of the semiconductor forming chamber and the amount of produced powder, so that the frequency of necessary maintenance becomes higher, so as to largely affect the operating rate of the entire system.

Let us consider herein a photoelectric conversion element having a pin junction as an example of the semiconductor element. The i-type semiconductor layer functioning as a light absorbing layer needs to be thicker than the p-type semiconductor layer and the n-type semiconductor layer and is a portion having the largest rate of occupancy in the semiconductor layers. Therefore, for the purposes of enhancing productivity of the semiconductor element, compactifying the apparatus, etc., studies are under way to seek various methods for increasing the film forming rate of the i-type semiconductor layer. Conceivable deposition conditions for increasing the film forming rate include a method of increasing the high-frequency power to be introduced, a method of increasing the flow rate of source gas, a method of decreasing the distance between the substrate and the high-frequency introducing part, a method of increasing the high-frequency power per plasma space, and so on, but these also induce increase in the deposition of film to the interior of the semiconductor forming chamber and in the amount of produced powder, thus being the factor of increasing the frequency of maintenance.

On the other hand, known as one of potent means for improving the characteristics of the photoelectric conversion element is a so-called stack type that consists of a plurality of pin junctions made so as to stack semiconductor layers with different energy gaps and that can collect a wider optical energy spectrum. The spectral sensitivity as a whole of the photoelectric conversion element can be enhanced by using a wide bandgap material on the light incidence side and combining it with a narrow bandgap material. Specific configuration examples thereof include a-Si/a-SiGe, a-SiC/a-Si, a-Si/μC—Si, and so on. These can also be applied to structures of three or more pin junctions combined.

When the photoelectric conversion element is of the stack type structure as described above, the i-type semiconductor layers exist apart from each other and those i-type semiconductor layers are usually different in film thickness and composition from each other. Therefore, they are different in the frequency of maintenance and in the time necessary for maintenance. For that reason, where all the semiconductor forming chambers are continuously coupled to form the semiconductor layers continuously, the operating rate of the entire system is dominated by the maintenance of the i-type semiconductor forming chamber having the highest maintenance frequency. When the system is constructed so as to perform the exposure to the atmosphere in a step between the forming steps of the i-type semiconductor layers spaced from each other, it is also possible to make and store regions of some pin junctions (or part of a pin junction) of the semiconductor element in the apparatus not subjected to the maintenance as occasion may demand, which can enhance the total productivity of semiconductor element. The productivity can also be enhanced further by providing a plurality of semiconductor forming apparatuses and forming the semiconductor layers with high maintenance frequency in the greater number of semiconductor forming apparatuses.

When the exposure to the oxygen-containing atmosphere (also including the case of the exposure to the atmosphere) is carried out in the aforementioned step, a partial region of the semiconductor element consisting of a plurality of pin junctions can be extracted in a pin junction form, which makes it feasible to evaluate characteristics as a pin junction element for the partial region in the semiconductor element having the plurality of pin junctions of silicon-based thin films. This makes it feasible to extract a local area of the semiconductor element and check characteristics thereof on the occasion of the exposure to the atmosphere in the production process. When this property check is incorporated in the production steps, it becomes feasible to perform much detailed check. If a defect is found in the intermediate check and soon diagnosed, it will be feasible to control production of defective products and to narrow down causes of the defect and thus specify the cause quicker.

When film formation is continuously carried out over long periods, the region surrounding the plasma in the semiconductor forming chambers is heated by the long-term plasma irradiation to cause such effects as change of the plasma atmosphere with a lapse of time, variation in the degassing amount from the apparatus into the plasma atmosphere, etc., which yields the time dependence of the characteristics of the semiconductor element produced and which can be the cause of degrading the evenness of the semiconductor element.

When the steps of forming the semiconductor layers include the step of the exposure to the oxygen-containing atmosphere herein as in the present invention, in the case where the steps before and after the exposure to the oxygen-containing atmosphere are denoted by a first semiconductor layer (n-i-p structure or p-i-n structure) forming step and a second semiconductor layer (p-n-i-p structure or n-p-i-n structure) forming step, respectively, a region produced in the initial stage of the first semiconductor layer forming step is made in the late stage of the second semiconductor layer forming step and a region produced in the late stage of the first semiconductor layer forming step is made in the initial stage of the second semiconductor layer forming step, which can cancel the time dependence of the characteristics of the semiconductor element, thereby enhancing the evenness of the semiconductor element formed.

When the semiconductor element is made by the Roll to Roll system and when the exposure to the oxygen atmosphere is carried out in the wound state of the substrate on the roll, on the occasion of winding the substrate after completion of the first semiconductor forming step, the initial part in the first semiconductor forming step is wound up so as to be located inside of the wound part and the late part in the first semiconductor forming step is wound up so as to be located outside of the wound part. For this reason, when the second semiconductor is formed with the substrate being unwound from the roll after the exposure to the oxygen atmosphere, the late part in the first semiconductor forming step is naturally carried out in the initial stage of the second semiconductor forming step. Thus the aforementioned action is automatically effected in this case. For this reason, the aforementioned configuration can be substantiated without complicated step management, which is preferable. During the winding of the substrate, it is preferable to simultaneously wind up a protective material between, because it can prevent production of flaws on the substrate. The protective material is preferably a fibrous material such as interleaving paper or the like in particular, because the substrate is kept in close fit with the protective material and because the oxygen-containing layer is thus formed with better uniformity because of oxygen included in the material and on the surface.

Figure 2:
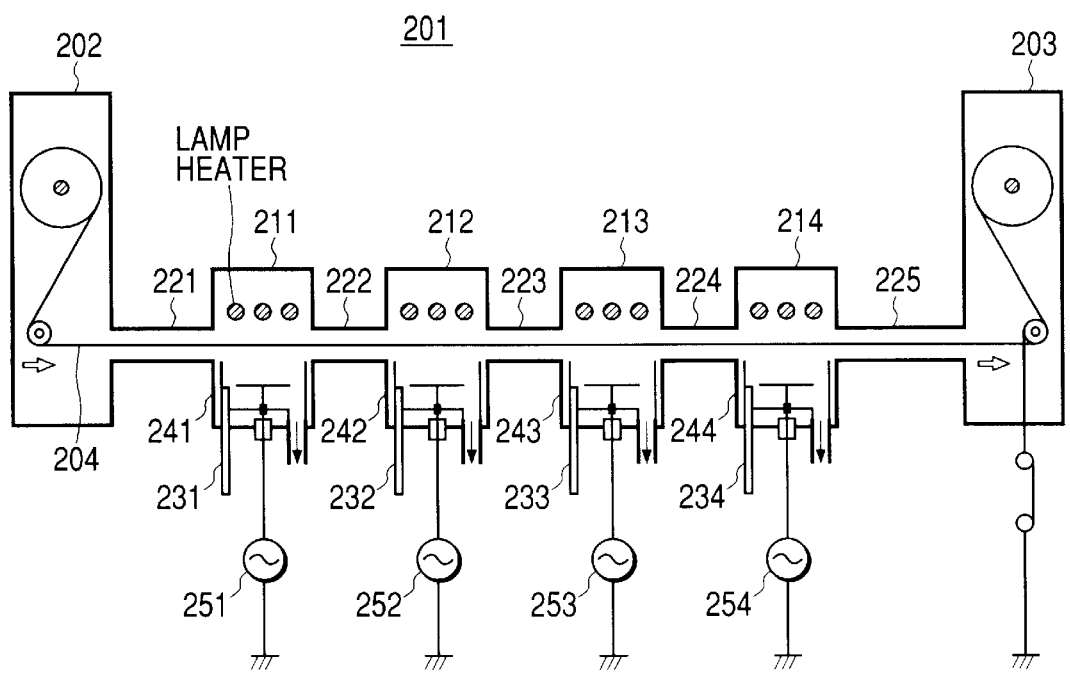
FIG. 2 is a schematic, cross-sectional view showing an example of a deposited film forming apparatus for producing the semiconductor element of the present invention and the photovoltaic element.

In the case of the semiconductor element having a plurality of pin junctions, as described previously, a plurality of i-type semiconductor layers exist apart from each other and these i-type semiconductor layers are usually different in the structure, e.g., film thickness, composition, crystallinity, and so on. They are often made under different conditions for formation of the semiconductor layer, particularly, at different forming temperatures. When the semiconductor element is formed by the Roll to Roll system, it is normally produced by a deposited film forming apparatus provided with a substrate feeding chamber, semiconductor forming vacuum chambers, and a substrate winding chamber as shown in FIG. 2 and the semiconductor layers are made with tensile stress being exerted on the substrate. The tensile stress exerted on the substrate herein is optimized under such conditions that smooth substrate conveyance is allowed, consistency is established on the basis of expansion and contraction applied to the substrate with heat, and good adhesion is ensured between the deposited film and the substrate. In the semiconductor element with plural pin junctions, where optimal tensile stresses are different because of difference between forms of the i-type semiconductor layers, it is preferable to carry out the exposure to the oxygen atmosphere in the wound state of the substrate on the roll at at least one portion between pin junctions adjacent to each other, as in the preferred embodiment of the present invention, because it becomes feasible to form the respective i-layers independently of each other and control the tensile stresses independently as well. A preferred range of the tensile stress in the semiconductor forming steps is, for example, $6.0 \text{ N/mm}^2$ to $20 \text{ N/mm}^2$. If the tensile stress in the late step is greater, there will occur weaving (run out in the width direction during winding) of the substrate upon application of tensile stress and it can cause trouble in handling of the substrate thereafter or produce flaws due to tightness of winding. Therefore, the tensile stress before the exposure to the oxygen atmosphere is preferably greater than the tensile stress after the exposure to the oxygen atmosphere.

When the length of the substrate along the conveyance direction (the winding length on the roll) is long, it is preferable to decrease the tensile stress continuously or stepwise in each semiconductor forming step, in order to prevent the weaving. As for the magnitude of the tensile stress, the tensile stress at the end to the tensile stress at the start is preferably in the range of 50% to 90%.

Each of components will be described below, using an example of a photovoltaic element as a semiconductor element of the present invention.

FIG. 1 is a schematic, cross-sectional view showing an example of the photovoltaic element according to the present invention. In the drawing, reference numeral 101 designates a substrate, 102 a semiconductor layer, 103 a second, transparent, conductive layer, and 104 a collector electrode. Further, numeral 101-1 denotes a base member, 101-2 a metal layer, and 101-3 a first, transparent, conductive layer. These are constitutive members of the substrate 101.

Base Member

The base member 101-1 is suitably selected from platelike members and sheetlike members of metal, resin, glass, ceramics, semiconductor bulks, and so on. The surface of the base member may have microscopic unevenness. It is also possible to employ a transparent base member in a configuration where light is incident from the base member side. When the base member is of elongated shape, it is feasible to perform continuous film formation by the Roll to Roll system. Particularly, a flexible material such as stainless steel, polyimide, or the like is suitably used as a material of the base member 101-1.

Metal Layer

The metal layer 101-2 serves as an electrode and also serves as a reflecting layer that reflects the light reaching the base member 101-1 to utilize the reflected light again in the semiconductor layer 102. The material of the metal layer can be suitably selected from Al, Cu, Ag, Au, CuMg, AlSi, and so on. A method of forming the metal layer can be suitably selected from such methods as evaporation, sputtering, electrodeposition, printing, and so on. The metal layer 101-2 preferably has unevenness in the surface thereof. The unevenness can expand the optical path lengths of reflected light in the semiconductor layer 102, so as to increase the short circuit current. When the base member 101-1 is electrically conductive, the metal layer 101-2 does not always have to be formed.

First, Transparent, Conductive Layer

The first, transparent, conductive layer 101-3 functions to enhance diffuse reflection of the incident light and reflected light and expand the path lengths thereof in the semiconductor layer 102. It also functions to prevent the element of the metal layer 101-2 from diffusing or migrating into the semiconductor layer 102 to shunt the photovoltaic element. Further, the first, transparent, conductive layer 101-3 has a moderate resistance, whereby it functions to prevent a short circuit due to defects such as pinholes or the like in the semiconductor layer. Further, the first, transparent, conductive layer 101-3 desirably has unevenness in the surface thereof as the metal layer 101-2 does. The first, transparent, conductive layer 101-3 is preferably comprised of a conductive oxide such as ZnO, ITO, or the like and is preferably made by a method such as evaporation, sputtering, CVD, electrodeposition, or the like. The first, transparent, conductive layer 101-3 may also be made of either of these conductive oxides doped with a material to change the electric conductivity.

A method of forming a zinc oxide layer is preferably selected from such methods as sputtering, electrodeposition, and the like, or combinations of these methods.

Among conditions for forming the zinc oxide film by sputtering, those causing significant effect include the method, type and flow rate of gas, internal pressure, input power, film-forming rate, substrate temperature, and so on. For example, where the zinc oxide film is made by the DC magnetron sputtering method using a zinc oxide target, the type of gas is selected from Ar, Ne, Kr, Xe, Hg, $O_2$, and so on, and the flow rate depends upon the size of the apparatus and the exhaust rate; for example, in the case of the film-forming space having the volume of 20 l, the flow rate is desirably 1 sccm to 100 sccm. The internal pressure during the film formation is desirably $1\times10^{-4}$ Torr to 0.1 Torr. Although depending upon the size of the target, the input power is desirably 10 W to 100 kW in the case of the diameter of 15 cm. The preferred range of the substrate temperature varies depending upon the film-forming rates, but in the case of the film formation at 1 $\mu$m/h, it is desirably 70° C. to 450° C.

A preferred condition for formation of the zinc oxide film by the electrodeposition method is use of an aqueous solution containing nitric ions and zinc ions in a corrosion-resistant vessel. Concentrations of nitric ions and zinc ions are desirably in the range of 0.001 mol/l to 1.0 mol/l, more desirably in the range of 0.01 mol/l to 0.5 mol/l, and still more desirably in the range of 0.1 mol/l to 0.25 mol/l. There are no specific restrictions on supply sources of the nitric ions and zinc ions, and the supply source may be zinc nitrate as a supply source of the both ions or a mixture of a water-soluble nitrate, such as ammonium nitrate or the like, as a supply source of nitric ions and a zinc salt, such as zinc sulfate or the like, as a supply source of zinc ions. Further, it is also preferable to add a carbohydrate to these aqueous solutions in order to suppress abnormal growth or enhance the adhesion. There are no specific restrictions on the type of the carbohydrate, and it can be selected from monosaccharides such as glucose (grape sugar), fructose (fruit sugar), and so on; disaccharides such as maltose (malt sugar), saccharose (cane sugar), and so on; polysaccharides such as dextrine, starch, and so on; and mixtures of these. An amount of the carbohydrate in the aqueous solution is determined depending upon the type of the carbohydrate, but it is approximately desirably in the range of 0.001 g/l to 300 g/l, more desirably in the range of 0.005 g/l to 100 g/l, and still more desirably in the range of 0.01 g/l to 60 g/l. When the zinc oxide film is deposited by the electrodeposition method, it is preferable to use the base member, onto which the zinc oxide film is to be deposited, as a cathode in the aqueous solution and use zinc, platinum, carbon, or the like as an anode. The current density through the load resistance at this time is preferably 10 mA/dm to 10 A/dm.

Substrate

By the above-described methods, the substrate 101 is formed by depositing the metal layer 101-2 and the first, transparent, conductive layer 101-3 on the base member 101-1 as occasion demands. For facilitating integration of elements, the substrate 101 may be provided with an insulating layer as an intermediate layer.

Semiconductor Layer

A principal material of the semiconductor layer 102, part of which is comprised of silicon-based thin films of the present invention, is Si. In addition to Si, an alloy of Si with C or Ge may also be used. For making the semiconductor layer as a p-type semiconductor layer, the semiconductor layer is made to contain a III-element, and for making it as an n-type semiconductor layer, the semiconductor layer is made to contain a V-element. As the electric property of the p-type layer and the n-type layer, the activation energy is preferably not more than 0.2 eV and most preferably not more than 0.1 eV. The resistivity is preferably not more than 100 Ωcm and most preferably not more than 1 Ωcm. In the stack cell case, a preferred configuration is such that the bandgap is set wide for the i-type semiconductor layers of pin junctions close to the light incidence side and the bandgap becomes narrower with distance from the light incidence side toward the distant pin junctions. A crystalline semiconductor with little absorption of light or a semiconductor with a wide bandgap is suitable for the doped layer (the p-type layer or the n-type layer) on the light incidence side.

Figure 3:
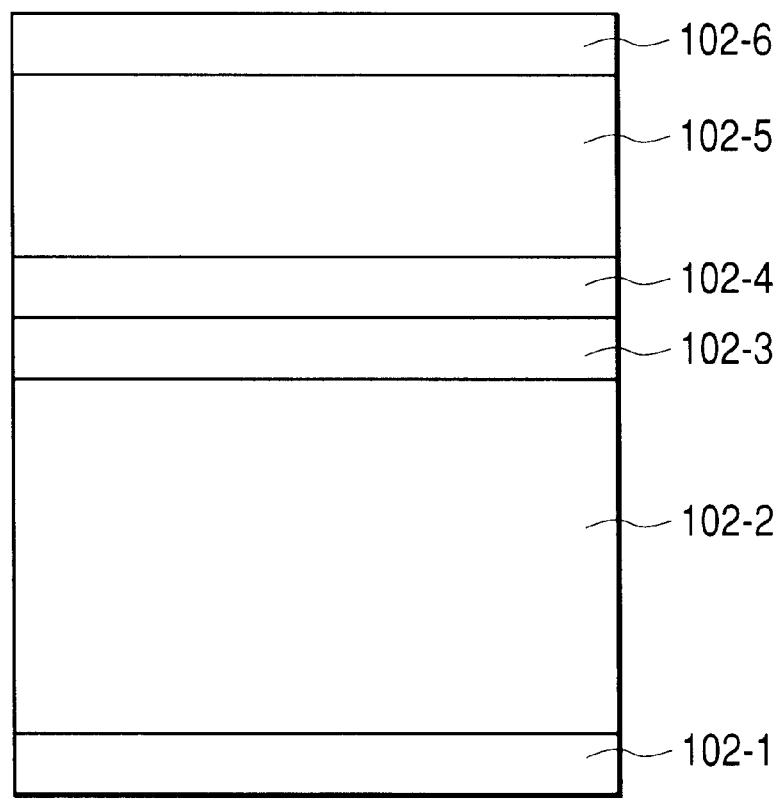
FIG. 3 is a schematic, cross-sectional view showing an example of semiconductor layers including a semiconductor element of the present invention.

The semiconductor layer 102 being the constitutive element of the present invention will be described in further detail. FIG. 3 is a schematic, cross-sectional view showing the semiconductor layer 102 having two sets of pin junctions as an example of the photovoltaic element of the present invention. In the drawing, reference numerals 102-1 and 102-4 designate semiconductor layers of a first conductivity type, 102-2 and 102-5 i-type semiconductor layers, and 102-3 and 102-6 semiconductor layers of a second conductivity type.

The combination of the i-type silicon-based semiconductor layers in the stack cell with a stack of two sets of pin junctions can be selected from (amorphous silicon semiconductor layer; amorphous silicon semiconductor layer), (amorphous silicon semiconductor layer; silicon semiconductor layer comprising microcrystals), and (silicon semiconductor layer comprising microcrystals; silicon semiconductor layer comprising microcrystals) from the light incidence side. As examples of the photovoltaic element with a stack of three sets of pin junctions, the combination of i-type silicon-based semiconductor layers can be selected from (amorphous silicon semiconductor layer; amorphous silicon semiconductor layer; amorphous silicon semiconductor layer), (amorphous silicon semiconductor layer; amorphous silicon semiconductor layer; silicon semiconductor layer comprising microcrystals), (amorphous silicon semiconductor layer; silicon semiconductor layer comprising microcrystals; silicon semiconductor layer comprising microcrystals), (amorphous silicon semiconductor layer; silicon semiconductor layer comprising microcrystals; amorphous silicon germanium semiconductor layer), and (silicon semiconductor layer comprising microcrystals; silicon semiconductor layer comprising microcrystals; silicon semiconductor layer comprising microcrystals) from the light incidence side. The i-type semiconductor layers are preferably those having such properties that the absorption coefficient ($\alpha$) at the wavelength (630 nm) of light is not less than 5000 $cm^{-1}$, the photoconductivity ($\sigma p$) under irradiation with artificial sunlight by a solar simulator (AM 1.5, 100 $mW/cm^2$) is not less than $10 \times 10^{-5}$ S/cm, the dark conductivity ($\sigma d$) is not more than $10 \times 10^{-6}$ S/cm, and the Urbach energy by the constant photocurrent method (CPM) is not more than 55 meV. The i-type semiconductor layers may be those slightly leaning to the p-type or the n-type. When the i-type semiconductor layer is a silicon germanium semiconductor layer or a silicon semiconductor layer comprising microcrystals, an amorphous silicon i-type semiconductor layer may be interposed at at least one of the p/i interface and the n/i interface in order to decrease interface states and increase the open voltage.

Method of Forming Semiconductor Layer

The high-frequency plasma CVD process is suitable for forming the silicon-based thin films and semiconductor layer 102 of the present invention. The following will describe a preferred example of the procedure for forming the semiconductor layer 102 by the high-frequency plasma CVD process.

(1) The interior of the semiconductor forming vacuum chamber, which can be brought into a depressurized state, is depressurized to a predetermined deposition pressure.

(2) Material gas of source gas, diluent gas, etc. is introduced into the deposition chamber, and the interior of the deposition chamber is set to a predetermined deposition pressure while evacuating the interior of the deposition chamber by a vacuum pump.

(3) The substrate 101 is set at a predetermined temperature by a heater.

(4) A high-frequency wave oscillated by a high-frequency power supply is introduced into the deposition chamber. A method of introducing the high-frequency wave into the deposition chamber can be selected from the following methods: in the case of the high-frequency wave being a microwave, it is guided through a waveguide tube and via a dielectric port of quartz, alumina, aluminum nitride, or the like into the deposition chamber; in the case of the high-frequency wave being VHF or RF, it is guided through a coaxial cable and via a metal electrode into the deposition chamber.

(5) A plasma is induced in the deposition chamber to decompose the source gas and form a deposited film on the substrate 101 placed in the deposition chamber. This procedure is repeated plural times according to necessity to form the semiconductor layer 102.

Preferred forming conditions of the semiconductor layer 102 are that the substrate temperature in the deposition chamber is 100 to 450° C., the pressure is 0.067 Pa (0.5 mTorr) to $1.5 \times 10^4$ Pa (113 Torr), and the high-frequency power density is 0.001 to 2 $W/cm^3$. It is also preferable to employ such a method that a dc power supply is connected through a choke coil to the high-frequency introducing part to superimpose a dc component on the high-frequency wave as occasion may demand.

The source gas suitable for the formation of the semiconductor layer 102 of the present invention is selected from silicon fluorides such as $SiF_4$, $SiH_2F_2$, $SiH_3F$, $Si_2F_6$, and so on, and silicon hydrides such as $SiH_4$, $Si_2H_6$, and so on. For making the alloy base semiconductor layer, it is desirable to introduce a gasifiable compound containing Ge or C, such as $GeH_4$ or $CH_4$ or the like, diluted with hydrogen gas, into the deposition chamber. An inert gas such as He or the like may also be further added. A dopant gas for changing the semiconductor layer into the p-type layer is selected from $B_2H_6$, $BF_3$, and so on. A dopant gas for changing the semiconductor layer into the n-type layer is selected from $PH_3$, $PF_3$, and so on. For depositing a layer with little absorption of light or a layer with a wide bandgap, such as a thin film of crystal phase, SiC, or the like, it is preferable to increase the ratio of the diluent gas to the source gas and introduce the high-frequency wave in a relatively high power density.

For forming the semiconductor layer in a large area, the method of introducing the source gas into the vacuum chamber is preferably a method of providing the high-frequency introducing part with a plurality of holes and introducing the source gas in a shower form through the holes into the plasma space, a method of placing a gas introducing tube with a plurality of holes in the plasma space, or the like, because a uniform plasma can be established.

Second, Transparent, Conductive Layer

The second, transparent, conductive layer 103 functions as an electrode on the light incidence side and also functions as an antireflection film the thickness of which is set at an appropriate value. The second, transparent, conductive layer 103 is required to have a high transmittance in the absorbable wavelength region of the semiconductor layer 102 and have a low resistivity. The transmittance of the layer 103 at 550 nm is preferably not less than 80% and more preferably not less than 85%. The resistivity is preferably not more than $5 \times 10^{-3}$ Ωcm and more preferably not more than $1 \times 10^{-3}$ Ωcm. A material of the second, transparent, conductive layer 103 can be suitably selected from ITO, ZnO, $In_2O_3$, and so on. A method of making the second layer 103 can be suitably selected from such methods as evaporation, CVD, spraying, spin-on process, dipping, and so on. The material of the layer 103 may be selected from these materials doped with a substance to change the electric conductivity.

Collector Electrode

The collector electrode 104 is laid on the transparent electrode 103 in order to increase the electricity collection efficiency. A method of forming the collector electrode 104 is suitably selected from a method of forming metal in an electrode pattern through use of a mask by sputtering, a method of printing a conductive paste or a soldering paste, a method of securing metal lines with an electroconductive paste, and so on.

Protective layers are sometimes formed on the both surfaces of the photovoltaic element as occasion may demand. At the same time as it, a reinforcing material such as a steel sheet or the like may also be used on the back side of the photovoltaic element (on the opposite side to the light incidence side).

EXAMPLES

In the examples below, the present invention will be specifically described using examples of solar cells as semiconductor elements, but it is noted that these examples do not limit the essence of the present invention at all.

Example 1

Figure 5:
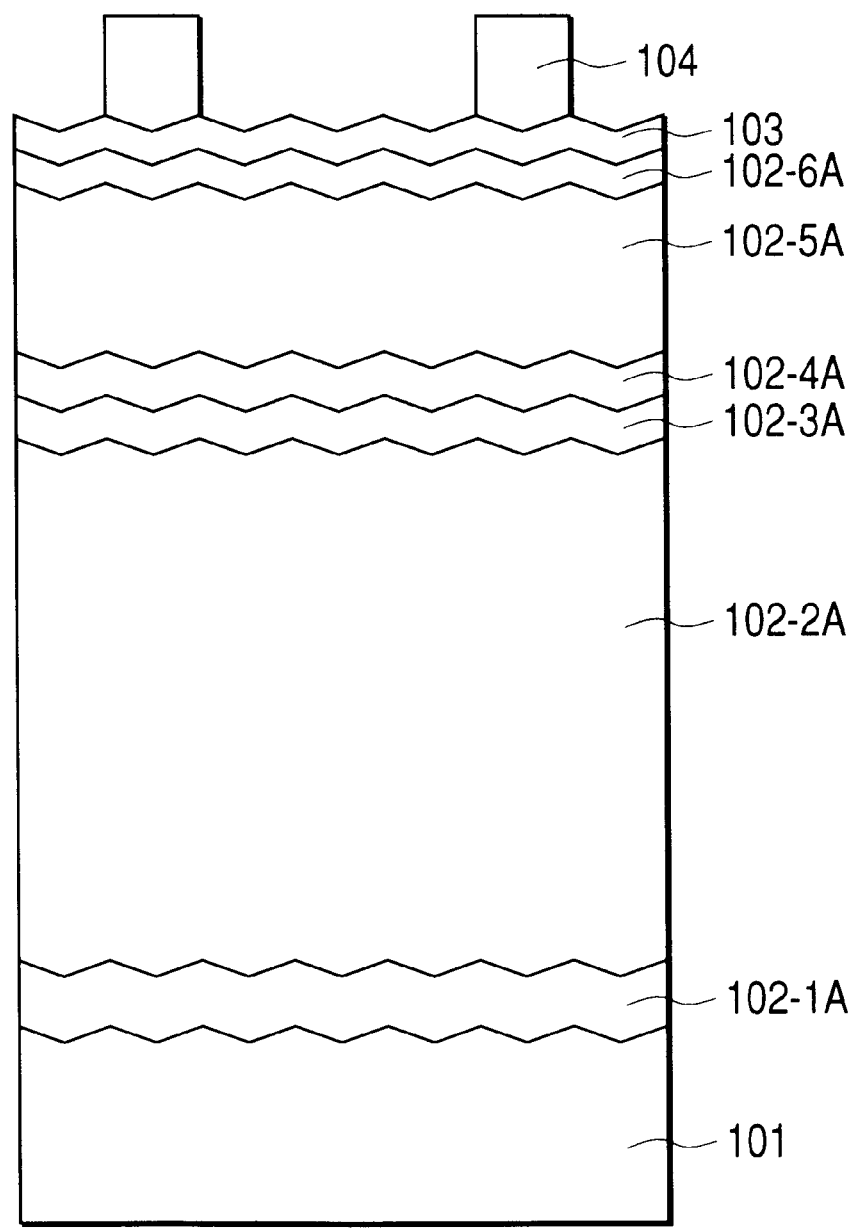
FIG. 5 is a schematic, cross-sectional view showing an example of a photovoltaic element including a semiconductor element of the present invention.

Using the deposited film forming apparatus 201 shown in FIG. 2, the photovoltaic element shown in FIG. 5 was made according to the following procedures. FIG. 5 is a schematic, cross-sectional view showing an example of the photovoltaic element having the silicon-based thin films of the present invention. In the drawing, members similar to those in FIG. 1 are denoted by the same reference symbols and the description thereof is omitted herein. The semiconductor layer of this photovoltaic element is comprised of an amorphous n-type semiconductor layer 102-1A, a microcrystalline i-type semiconductor layer 102-2A, and a microcrystalline p-type semiconductor layer 102-3A; and an amorphous n-type semiconductor layer 102-4A, an amorphous i-type semiconductor layer 102-5A, and a microcrystalline p-type semiconductor layer 102-6A. Namely, this photovoltaic element is a so-called pinpin type double cell photovoltaic element.

FIG. 2 is a schematic, cross-sectional view showing an example of the deposited film forming apparatus for producing the silicon-based thin films and the photovoltaic element of the present invention. The deposited film forming apparatus 201 shown in FIG. 2 is constructed in such structure that a substrate feeding chamber 202, semiconductor forming vacuum chambers 211 to 214, and a substrate winding chamber 203 are coupled through gas gates 221 to 225. In this deposited film forming apparatus 201, the belt-like conductive substrate 204 is set through each chamber and each gas gate. The belt-like conductive substrate 204 is unwound from a bobbin placed in the substrate feeding chamber 202 and is wound up onto another bobbin placed in the substrate winding chamber 203.

Each of the semiconductor forming vacuum chambers 211 to 214 has a deposition chamber forming a plasma generating region. The deposition chamber is constructed so that the discharge space for the plasma to be induced is defined vertically by the conductive substrate and the high-frequency introducing part and laterally by a discharge plate mounted so as to surround the high-frequency introducing part.

The high-frequency power from high-frequency power supply 251 to 254 is applied to the platelike high-frequency introducing part 241 to 244 in the deposition chamber to induce glow discharge, and the source gas is decomposed thereby to deposit the semiconductor layer on the conductive substrate 204. The high-frequency introducing part 241 to 244 is opposed to the conductive substrate 204 and is provided with a height adjusting mechanism not shown. The height adjusting mechanism enables change in the distance between the conductive substrate and the high-frequency introducing part and change in the volume of the discharge space at the same time. A gas introducing pipe 231 to 234 for introducing the source gas and the diluent gas is connected to each semiconductor forming vacuum chamber 211 to 214.

Each semiconductor forming vacuum chamber is provided with a film forming area adjuster plate, not shown, for adjusting the contact area between the conductive substrate 204 and the discharge space in each deposition chamber. Although the deposited film forming apparatus 201 shown in FIG. 2 is provided with the four semiconductor forming vacuum chambers, the glow discharge does not have to be induced in all the semiconductor forming vacuum chambers, and whether the glow discharge is to be induced in each chamber can be determined according to the layer configuration of the photovoltaic element to be produced. Each semiconductor forming vacuum chamber is provided with a film forming area adjuster plate, not shown, for adjusting the contact area between the conductive substrate 204 and the discharge space in each deposition chamber.

First, the belt-like base member (50 cm wide, 1500 m long, and 0.125 mm thick) of stainless steel (SUS430BA) was degreased and cleaned well, and was mounted in an unrepresented continuous sputtering system. A thin film of Ag was evaporated in the thickness of 100 nm on the base member by sputtering, using an Ag electrode as a target.

Further, a thin film of ZnO was evaporated in the thickness of 1.2 μm on the Ag thin film by sputtering, using a ZnO target, to obtain the belt-like conductive substrate 204.

A bobbin with the conductive substrate 204 thereon was then mounted in the substrate feeding chamber 202, and the conductive substrate 204 was guided through the entrance gas gate, the semiconductor forming vacuum chambers 211, 212, 213, 214, and the exit gas gate to the substrate winding chamber 203. The tensile stress of 12 N/mm$^2$ was exerted on the belt-like conductive substrate 204 so as to prevent the slack thereof. Then the substrate feeding chamber 202, semiconductor forming vacuum chambers 211, 212, 213, 214, and substrate winding chamber 203 were fully evacuated down to not more than 5.0×10$^{-4}$ Pa by an evacuation system consisting of a vacuum pump not shown.

While actuating the evacuation system, the source gas and diluent gas was supplied through the gas introducing pipe 232, 233, 234 into each semiconductor forming vacuum chamber 212, 213, 214. H$^2$ gas was supplied as gate gas at 500 sccm into each gas gate through each gate gas supply pipe not shown. In this state the exhaust capability of the evacuation system was adjusted to control the pressures in the semiconductor forming vacuum chambers 212, 213, 214 to predetermined pressures. The forming conditions were as presented in Table 1.

After the pressures became stable in the semiconductor forming vacuum chambers 212, 213, 214, the conductive substrate 204 was started to move in the direction from the substrate feeding chamber 202 to the substrate winding chamber 203.

Then the high-frequency waves were introduced from the high-frequency power supplies 252, 253, 254 to the high-frequency introducing parts 242, 243, 244 in the semiconductor forming vacuum chambers 212, 213, 214 to induce the glow discharge in the deposition chambers inside the semiconductor forming vacuum chambers 212, 213, 214, thereby forming an amorphous n-type semiconductor layer (30 nm thick), a microcrystalline i-type semiconductor layer (2.0 μm thick), and a microcrystalline p-type semiconductor layer (5 nm thick) on the conductive substrate 204 to obtain a pin junction of a bottom cell.

At this time, the high-frequency power at the frequency of 13.56 MHz and in the power density of 5 mW/cm$^3$ was introduced from the high-frequency introducing part 242 consisting of the metal electrode of Al into the semiconductor forming vacuum chamber 212; the high-frequency power at the frequency of 60 MHz and in the power density adjusted so as to be 400 mW/cm$^3$ was introduced from the high-frequency introducing part 243 consisting of the metal electrode of Al into the semiconductor forming vacuum chamber 213; the high-frequency power at the frequency of 13.56 MHz and in the power density of 30 mW/cm$^3$ was introduced from the high-frequency introducing part 244 consisting of the metal electrode of Al into the semiconductor forming vacuum chamber 214.

After completion of the formation of the bottom cell pin junction, the substrate winding chamber 203 was made to leak and the conductive substrate 204 was taken out in the wound state on the bobbin to be exposed to the atmosphere. The exposing conditions to the atmosphere at this time (temperature, humidity, and duration) were 25° C., 30%, and 20 minutes.

Subsequent to the above were formation of a portion of the p-type semiconductor layer of the bottom cell and formation of the pin junction of the top cell. The bobbin with the conductive substrate 204 thereon was mounted in the substrate feeding chamber 202, and the conductive substrate 204 was guided through the entrance gas gate, semiconductor forming vacuum chambers 211, 212, 213, 214, and exit gas gate to the substrate winding chamber 203. The tensile stress of 12 N/mm$^2$ was exerted on the belt-like conductive substrate 204 so as to prevent the slack thereof. Then the substrate feeding chamber 202, semiconductor forming vacuum chambers 211, 212, 213, 214, and substrate winding chamber 203 were evacuated well to not more than 5.0×10$^{-4}$ Pa by the evacuation system consisting of the vacuum pump not shown.

The formation of the top cell was conducted so that the part made in the latter half of the bottom cell forming step (to the middle) became the initial forming region. Specifically, the bobbin with the conductive substrate 204 thereon, having been exposed to the atmosphere, was set in the substrate feeding chamber 202 as it was.

While actuating the evacuation system, the source gas and diluent gas was supplied through the gas introducing pipe 231, 232, 233, 234 into each semiconductor forming vacuum chamber 211, 212, 213, 214. At the same time, H$_2$ gas was supplied as gate gas at 500 sccm into each gas gate through each gate gas supply pipe not shown. In this state the exhaust capability of the evacuation system was adjusted to control the pressures in the semiconductor forming vacuum chambers 211, 212, 213, 214 to predetermined pressures. The forming conditions were as presented in Table 2.

After the pressures became stable inside the semiconductor forming vacuum chambers 211, 212, 213, 214, the conductive substrate 204 was started to move in the direction from the substrate feeding chamber 202 to the substrate winding chamber 203.

Then the high-frequency waves were introduced from the high-frequency power supplies 251, 252, 253, 254 to the high-frequency introducing parts 241, 242, 243, 244 in the semiconductor forming vacuum chambers 211, 212, 213, 214 to induce the glow discharge in the deposition chambers inside the semiconductor forming vacuum chambers 211, 212, 213, 214, thereby forming a microcrystalline p-type semiconductor layer (5 nm thick), an amorphous n-type semiconductor layer (30 nm thick), an amorphous i-type semiconductor layer (30 nm thick), and a microcrystalline p-type semiconductor layer (10 nm thick) on the conductive substrate 204 to complete the double cells.

At this time, the high-frequency power at the frequency of 13.56 MHz and in the power density of 30 mW/cm$^3$ was introduced from the high-frequency introducing part 241 consisting of the metal electrode of Al into the semiconductor forming vacuum chamber 211; the high-frequency power at the frequency of 13.56 MHz and in the power density of 5 mW/cm$^3$ was introduced from the high-frequency introducing part 242 consisting of the metal electrode of Al into the semiconductor forming vacuum chamber 212; the high-frequency power at the frequency of 60 MHz and in the power density adjusted so as to be 100 mW/cm$^3$ was introduced from the high-frequency introducing part 243 consisting of the metal electrode of Al into the semiconductor forming vacuum chamber 213; the high-frequency power at the frequency of 13.56 MHz and in the power density of 30 mW/cm$^3$ was introduced from the high-frequency introducing part 244 consisting of the metal electrode of Al into the semiconductor forming vacuum chamber 214.

Using a continuous modularizing apparatus not shown, the belt-like photovoltaic element thus produced was processed into a solar cell module of 36 cm×22 cm (Example 1).

Figure 4:
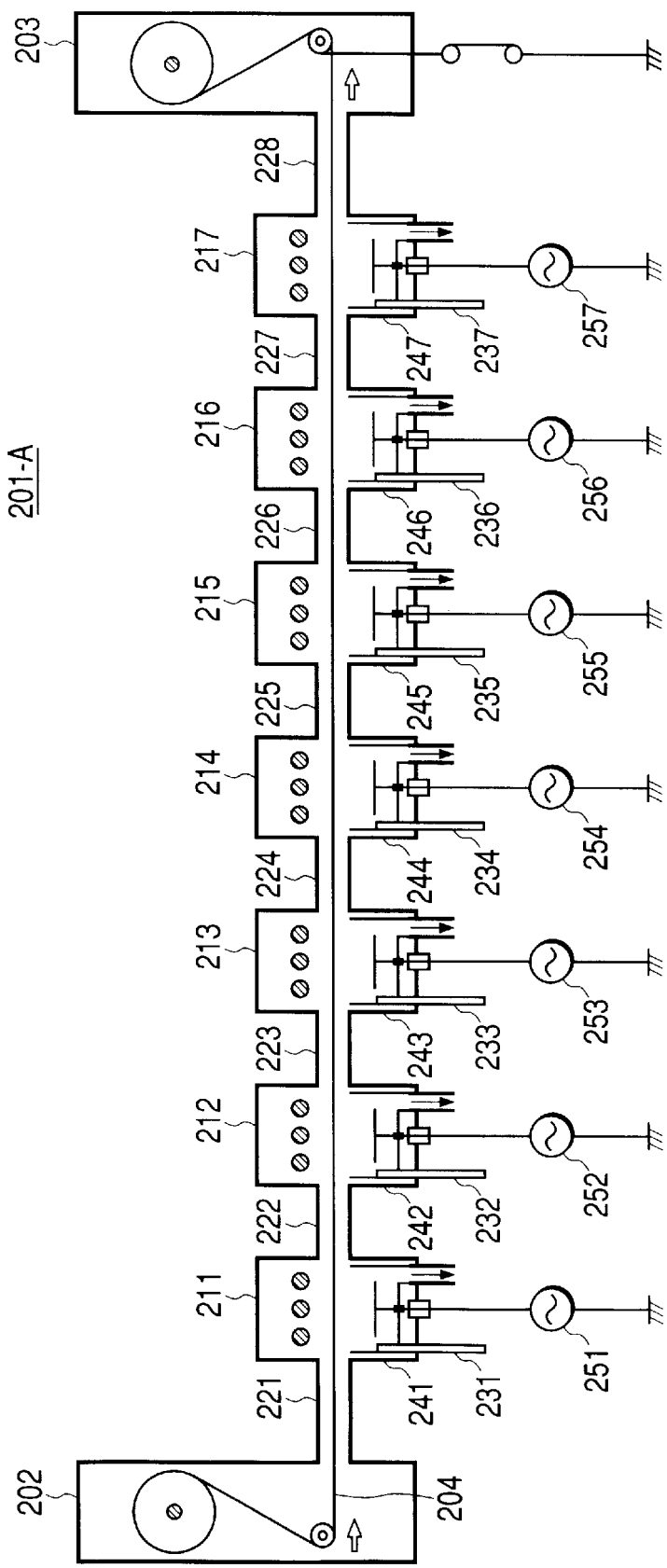
FIG. 4 is a schematic, cross-sectional view showing an example of a deposited film forming apparatus for producing the semiconductor element of the present invention and the photovoltaic element.

Next, a solar cell module was produced in much the same recipe as in Example 1, except that the exposure to the atmosphere was not executed in the steps of forming the bottom cell, using a deposited film forming apparatus 201-A shown in FIG. 4. The double cell configuration was an amorphous n-type semiconductor layer (30 nm thick), a microcrystalline i-type semiconductor layer (2.0 μm thick), a microcrystalline p-type semiconductor layer (5 nm thick), a microcrystalline p-type semiconductor layer (5 nm thick), an amorphous n-type semiconductor layer (30 nm thick), an amorphous i-type semiconductor layer (30 nm thick), and a microcrystalline p-type semiconductor layer (10 nm thick) from the substrate side (Comparative Example 1).

With the solar cell modules produced as described above, their photoelectric conversion efficiencies were measured using the solar simulator (AM 1.5, 100 mW/cm$^2$). The results are presented in Table 3. In Table 3 the substrate positions were determined by defining 0 m at the position at the start of production of the bottom cell on the belt-like substrate and 1500 m at the position at the end of production.

As apparent from Table 3, the solar cell module of Example 1 demonstrated the relatively high photoelectric conversion efficiencies and was also excellent in the evenness of photoelectric conversion efficiencies throughout the belt-like photoconductive substrate, as compared with the solar cell of Comparative Example 1. It is seen from the above that the solar cell including the semiconductor element of the present invention has the excellent characteristics.

Example 2

Figure 6:
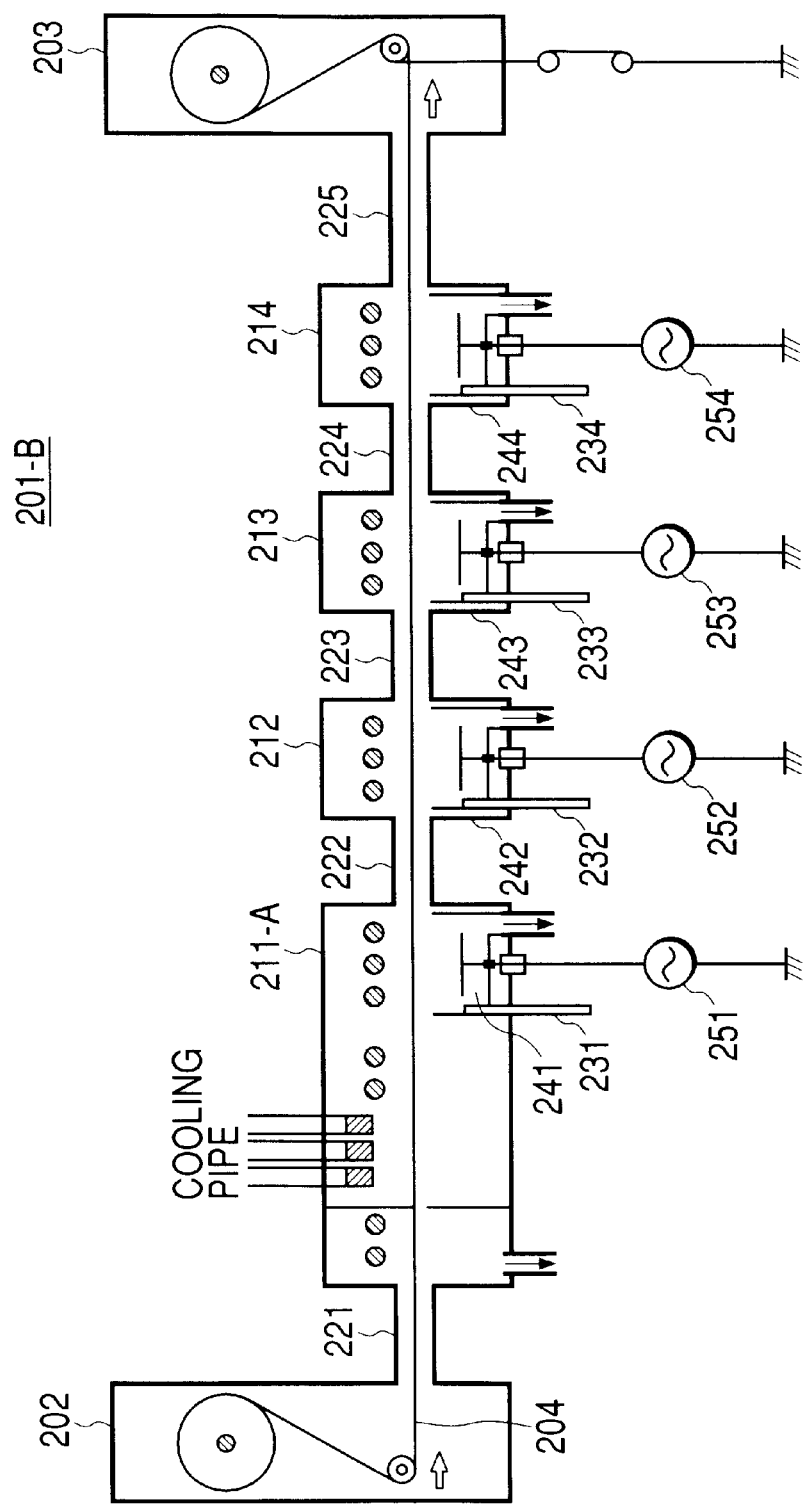
FIG. 6 is a schematic, cross-sectional view showing an example of a deposited film forming apparatus for producing the semiconductor element of the present invention and the photovoltaic element.

The photovoltaic element shown in FIG. 5 was produced using the deposited film forming apparatus 201 and 201-B shown in FIG. 2 and FIG. 6.

A solar cell module was produced under the conditions for formation of the respective semiconductor layers according to much the same method as in Example 1, except that the steps after the exposure to the atmosphere were carried out in the deposited film forming apparatus 201-B (Example 2). In the semiconductor forming vacuum chamber 211-A of the deposited film forming apparatus 201-B, before execution of formation of the semiconductor layer, the substrate was heated at 300° C. by a lamp heater, cooled at 150° C. by a cooling pipe with cooling water circulating therein, and again heated at 300° C.

With the solar cell module produced as described above, the photoelectric conversion efficiencies were measured using the solar simulator (AM 1.5, 100 mW/cm$^2$). The adhesion of the solar cell module was checked using the cross cut tape test (the gap intervals between cuts: 1 mm and the number of squares: 100). The results of these are presented in Table 4. In Table 4 the substrate positions were determined by defining 0 m at the position at the start of production of the bottom cell on the belt-like substrate and 1500 m at the position at the end of production. The peeling test results were evaluated according to the following criteria for the number of peeled squares: ⊚0; ◯1 to 2; Δ3 to 10; ×10 to 100.

As apparent from Table 4, the solar cell module of Example 2 was superior in the photoelectric conversion efficiency to that of Example 1. From the peeling tests, the solar cell modules of Example 1 and Example 2 both demonstrated excellent results, but the solar cell module of Example 2 was superior to that of Example 1. It is seen from the above that the solar cell module including the semiconductor element of the present invention has the excellent characteristics.

Example 3

The photovoltaic element shown in FIG. 5 was produced using the deposited film forming apparatus 201 shown in FIG. 2.

A solar cell module was produced in much the same method as in Example 1, except that the tensile stress exerted on the substrate in the formation of the top cell was 10 N/mm$^2$ (Example 3).

With the solar cell module produced as described above, the photoelectric conversion efficiencies were measured using the solar simulator (AM 1.5, 100 mW/cm$^2$). The solar cell module, the initial photoelectric conversion efficiencies of which had preliminarily been measured, was subjected to 100 cycles of placing the module at a dark place under the temperature of 85° C. and the humidity of 85%, keeping it for 30 minutes, thereafter lowering the temperature to −20° C. in 70 minutes, keeping the module for 30 minutes, and returning the temperature and humidity again to 85° C. and 85% in 70 minutes. After completion of the cycles, the photoelectric conversion efficiencies were again measured to check change of photoelectric conversion efficiency due to the temperature and humidity test. The results of these are presented in Table 5. In Table 5 the substrate positions were determined by defining 0 m at the position at the start of production of the bottom cell on the belt-like substrate and 1500 m at the position at the end of production. The temperature and humidity test results were evaluated based on values of (photoelectric conversion efficiency after the test)/(photoelectric conversion efficiency before the test).

As apparent from Table 5, the solar cell module of Example 3 was superior in the photoelectric conversion efficiency to that of Example 1. From the temperature and humidity test, the solar cell modules of Example 1 and Example 3 both were excellent, but the solar cell module of Example 3 was superior to that of Example 1. It is seen from the above that the solar cell module including the semiconductor element of the present invention has the excellent characteristics.

Example 4

The photovoltaic element shown in FIG. 5 was produced using the deposited film forming apparatus 201 shown in FIG. 2.

A solar cell module was produced in much the same method as in Example 3, except that the tensile stress exerted on the substrate in the formation of the bottom cell was set to 13 N/mm$^2$ at the start of film formation, gradually decreased during the process of film formation, and set to 11 N/mm$^2$ at the end of film formation and that the tensile stress exerted on the substrate in the formation of the top cell was set to 10 N/mm$^2$ at the start of film formation and to 8.0 N/mm$^2$ at the end of film formation (Example 4).

The solar cell module of Example 4 also demonstrated the excellent results of the photoelectric conversion efficiency and the temperature and humidity test as that of Example 3 did. Further, in Example 4 the substrate was wound up onto the bobbin with less weaving in the substrate winding chamber 203. It is seen from the above that the solar cell module including the semiconductor element of the present invention has the excellent characteristics.

Example 5

Figure 7:
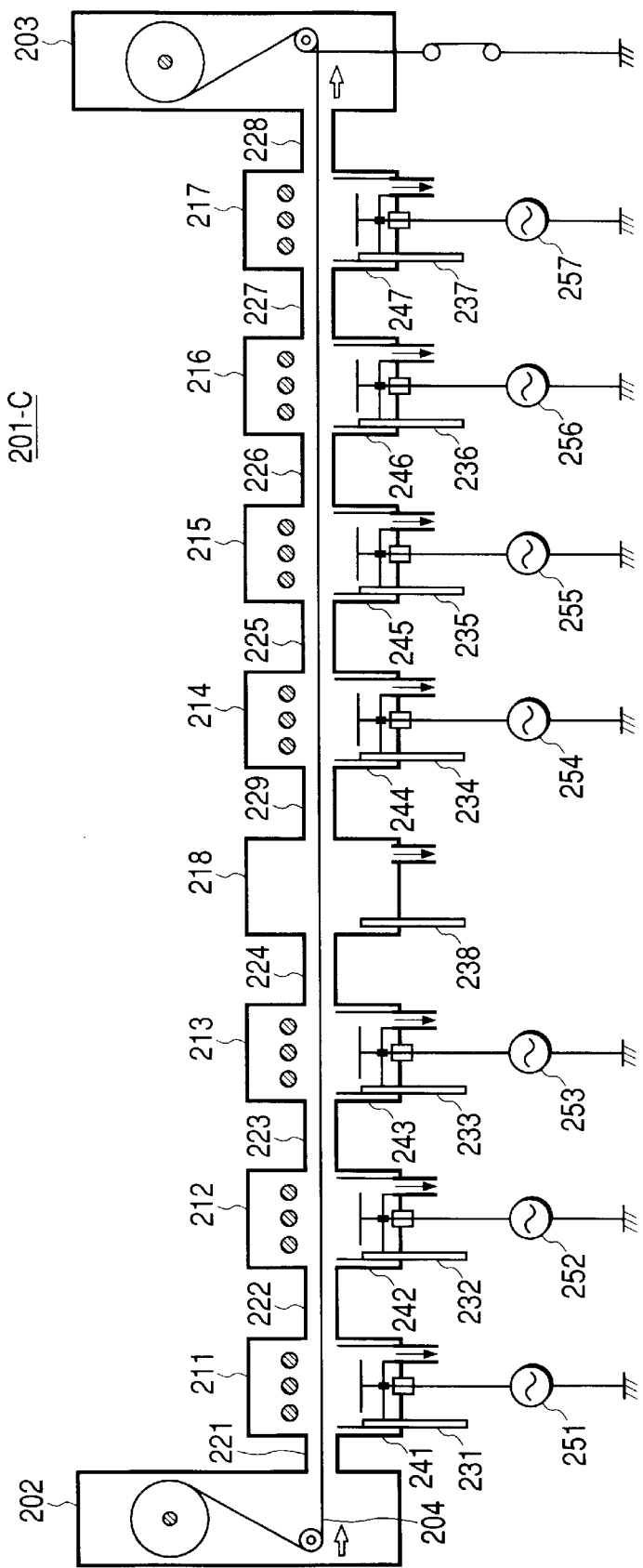
FIG. 7 is a schematic, cross-sectional view showing an example of a deposited film forming apparatus for producing the semiconductor element of the present invention and the photovoltaic element.

The photovoltaic element shown in FIG. 5 was produced using the deposited film forming apparatus 201-C shown in FIG. 7. The deposited film forming apparatus 201-C has an oxygen atmosphere forming vacuum chamber 217 placed between the forming steps of the p-layer of the bottom cell and is equivalent to the deposited film forming apparatus 201-A except for that. A gas containing oxygen gas can be introduced through a gas introducing pipe 237 into the oxygen atmosphere forming vacuum chamber 217 and the partial pressure of oxygen inside the oxygen atmosphere forming vacuum chamber 217 can be controlled by adjusting the exhaust capability of the evacuation system. The gas gates 224, 228 prevent oxygen in the oxygen atmosphere forming vacuum chamber 217 from diffusing into the semiconductor forming vacuum chambers.

While changing the partial pressure of oxygen inside the oxygen atmosphere forming vacuum chamber 217, a solar cell module was produced under much the same conditions as in Comparative Example 1, except that the residence period of the substrate in the oxygen atmosphere was five minutes.

With the solar cell module produced as described above, the photoelectric conversion efficiencies were measured using the solar simulator (AM 1.5, 100 mW/cm$^2$). The results are presented in Table 6. In Table 6 the photoelectric conversion efficiencies were evaluated by normalized values with respect to 1 for that at the position of 0 m in Comparative Example 1.

From Table 6, the solar cell module produced through the atmosphere at the oxygen partial pressure of not less than 1 Pa after the formation of the bottom cell demonstrated the high photoelectric conversion efficiencies. It is seen from the above that the solar cell including the semiconductor element of the present invention has the excellent characteristics.

The present invention permits the semiconductor element with the stack configuration of a number of silicon-based thin films to be formed efficiently, also permits the semiconductor element with better evenness and characteristics to be formed, and further permits the semiconductor element with excellent adhesion, environment resistance, etc. to be formed.

TABLE 1

| Forming Conditions for 212 | Source gas | SiH$_4$: 20 cm$^3$/min (normal)<br>H$_2$: 100 cm$^3$/min (normal)<br>PH$_3$ (Diluted to 2% with H$_2$): 30 cm$^3$/min (normal) |
|---|---|---|
| | Substrate temperature | 300° C. |
| | Pressure | 100 Pa |
| Forming Conditions for 213 | Source gas | SiH$_4$: 100 cm$^3$/min (normal)<br>SiF$_4$: 500 cm$^3$/min (normal)<br>H$_2$: 2000 cm$^3$/min (normal) |
| | Substrate temperature | 350° C. |
| | Pressure | 300 Pa |
| Forming Conditions for 214 | Source gas | SiH$_4$: 10 cm$^3$/min (normal)<br>H$_2$: 800 cm$^3$/min (normal)<br>BF$_3$ (Diluted to 2% with H$_2$): 100 cm$^3$/min (normal) |
| | Substrate temperature | 200° C. |
| | Pressure | 160 Pa |

TABLE 2

| Forming Conditions for 211 | Source gas | SiH$_4$: 10 cm$^3$/min (normal)<br>H$_2$: 800 cm$^3$/min (normal)<br>BF$_3$ (Diluted to 2% with H$_2$): 200 cm$^3$/min (normal) |
|---|---|---|
| | Substrate temperature | 200° C. |
| | Pressure | 160 Pa |
| Forming Conditions for 212 | Source gas | SiH$_4$: 20 cm$^3$/min (normal)<br>H$_2$: 100 cm$^3$/min (normal)<br>PH$_3$ (Diluted to 2% with H$_2$): 50 cm$^3$/min (normal) |
| | Substrate temperature | 300° C. |
| | Pressure | 100 Pa |
| Forming Conditions for 213 | Source gas | SiH$_4$: 300 cm$^3$/min (normal)<br>H$_2$: 4000 cm$^3$/min (normal) |
| | Substrate temperature | 300° C. |
| | Pressure | 1500 Pa |
| Forming Conditions for 214 | Source gas | SiH$_4$: 10 cm$^3$/min (normal)<br>H$_2$: 800 cm$^3$/min (normal)<br>BF$_3$ (Diluted to 2% with H$_2$): 100 cm$^3$/min (normal) |
| | Substrate temperature | 200° C. |
| | Pressure | 160 Pa |

TABLE 3

| | Substrate position (m) | Photoelectric conversion efficiency |
|---|---|---|
| Example 1 | 0 | 1 |
| Example 1 | 500 | 1.01 |
| Example 1 | 1000 | 0.99 |
| Example 1 | 1500 | 1.02 |
| Comparative Example 1 | 0 | 0.89 |
| Comparative Example 1 | 500 | 0.90 |
| Comparative Example 1 | 1000 | 0.93 |
| Comparative Example 1 | 1500 | 0.96 |

TABLE 4

| | Substrate position (m) | Photoelectric conversion efficiency | Peeling test |
|---|---|---|---|
| Example 1 | 0 | 1 | ○ |
| Example 1 | 500 | 1.01 | ○ |
| Example 1 | 1000 | 0.99 | ○ |
| Example 1 | 1500 | 1.02 | ○ |
| Example 2 | 0 | 1.05 | ◎ |
| Example 2 | 500 | 1.06 | ◎ |
| Example 2 | 1000 | 1.05 | ◎ |
| Example 2 | 1500 | 1.05 | ◎ |

TABLE 5

| | Substrate position (m) | Photoelectric conversion efficiency | Temperature-humidity test |
|---|---|---|---|
| Example 1 | 0 | 1 | 0.97 |
| Example 1 | 500 | 1.01 | 0.96 |
| Example 1 | 1000 | 0.99 | 0.97 |
| Example 1 | 1500 | 1.02 | 0.97 |
| Example 3 | 0 | 1.04 | 1.0 |
| Example 3 | 500 | 1.05 | 1.0 |
| Example 3 | 1000 | 1.05 | 1.0 |
| Example 3 | 1500 | 1.04 | 1.0 |

TABLE 6

| Partial pressure of oxygen | At position of 0 m in Comparative Example 1 (without passage through oxygen atmosphere) | 0.5 Pa | 1.0 Pa | 1.5 Pa |
|---|---|---|---|---|
| Photoelectric conversion efficiency | 1 | 0.98 | 1.13 | 1.15 |

What is claimed is:

1. A method of forming a semiconductor element having a plurality of pin junctions comprised of a silicon-based material, the method comprising:
 a step of forming a p-layer, an i-Layer, and a first portion of an n-layer of a first pin junction of the pin junctions or forming an n-layer, an i-layer, and a first portion of a p-layer of a first pin junction of the pin junctions, and thereafter exposing a surface of the first portion of the p-layer or the first portion of the n-layer to an oxygen-containing atmosphere;
 a step of forming a second portion of the p-layer on the first portion of the p-layer which was exposed to the oxygen-containing atmosphere or forming a second portion of the n-layer on the first portion of the n-layer which was exposed to the oxygen-containing atmosphere, to complete the first pin junction; and
 a step of forming an n-layer or a p-layer of a second pin junction adjacent to the first pin junction to form a pn interface,
 wherein the plurality of pin junctions is formed on a substrate by a high-frequency plasma CVD process under a pressure of not more than atmospheric pressure.

2. The method according to claim 1, wherein a dopant concentration of the first portion of the n-layer or the first portion of the p-layer is made smaller than a dopant concentration of the second portion of the n-layer or the second portion of the p-layer.

3. The method according to claim 1, wherein the oxygen-containing atmosphere is an atmosphere in which a partial pressure of oxygen is not less than 1 Pa.

4. The method according to claim 1, wherein the step of exposure to the oxygen-containing atmosphere is exposure to the atmosphere.

5. The method according to claim 1, wherein the i-layer of one of the first pin junction and the second pin junction is amorphous and the i-layer of the other comprises a crystal phase.

6. The method according to claim 1, wherein after the step of exposure to the oxygen-containing atmosphere, a step of heating, cooling, and heating is carried out at least once and thereafter formation of the second portion of the p-layer or the second portion of the n-layer is carried out to complete the first pin junction.

7. The method according to claim 6, wherein the step of heating, cooling, and heating is carried out in a hydrogen atmosphere.

8. The method according to claim 1, wherein the high-frequency plasma CVD process is a Roll to Roll system.

9. The method according to claim 8, wherein different tensile stresses are exerted on the substrate between before and after the step of exposure to the oxygen-containing atmosphere.

10. The method according to claim 9, wherein the tensile stress exerted on the substrate before the step of exposure to the oxygen-containing atmosphere is greater than the tensile stress exerted on the substrate after the step of exposure to the oxygen-containing atmosphere.

11. The method according to any one of claims 8 to 10, comprising a step of decreasing the tensile stress during a step of conveying the substrate by the Roll to Roll system.

12. The method according to claim 1, comprising a step of, while forming the first pin junction by the high-frequency plasma CVD process, conveying the substrate by a Roll to Roll system and winding up the substrate onto a roll; a step of exposing the substrate as wound on the roll to the oxygen-containing atmosphere; and a step of, while unwinding the substrate from the roll by the Roll to Roll system, conveying the substrate and forming the second portion of the p-layer on the first portion of the p-layer or forming the second portion of the n-layer on the first portion of the n-layer by the high-frequency plasma CVD process to complete the first pin junction, and further forming the second pin junction.

13. The method according to claim 12, wherein different tensile stresses are exerted on the substrate between before and after the step of exposure to the oxygen-containing atmosphere.

14. The method according to claim 12 or 13, wherein at least one of the tensile stresses exerted on the substrate before and alter the step of exposure to the oxygen-containing atmosphere is decreased during the step of conveying the substrate.

15. The method according to claim 1, wherein after formation of a portion of the n-layer or the p-layer of the second pin junction adjacent to the first pin junction, the portion of the n-layer or the p-layer of the second pin junction is exposed to an oxygen atmosphere.

16. A semiconductor element made by the semiconductor element forming method as set forth in any one of claims 1 to 10, 12, 13 and 15.

17. A method of forming a semiconductor element having a plurality of pin junctions comprised of a silicon-based material, the method comprising:
 a step of forming a first portion of a p-layer or a first portion of an n-layer of one of the plurality of pin junctions and thereafter exposing a surface of the first portion of the p-layer or the first portion of the n-layer to an oxygen-containing atmosphere; and
 a step of forming a second portion of the p-layer on the first portion of the p-layer which was exposed to the oxygen-containing atmosphere or forming a second portion of the n-layer on the first portion of the n-layer which was exposed to the oxygen-containing atmosphere,
 wherein the plurality of pin junctions is formed on a substrate by a high-frequency plasma CVD process under a pressure of not more than atmospheric pressure.

18. The method according to claim 17, wherein a dopant concentration of the first portion of the p-layer or the first portion of the n-layer is made smaller than the dopant concentration of the second portion of the p-layer or the second portion of the n-layer.

19. The method according to claim 17, comprising a step of, while forming at least a portion of the pin junction by the high-frequency plasma CVD process, conveying the substrate by a Roll to Roll system and winding up the substrate onto a roll; a step of exposing the substrate as wound on the roll to an oxygen-containing atmosphere; and a step of, while unwinding the substrate from the roll by the Roll to Roll system, conveying the substrate and forming the second portion of the p-layer on the first portion of the p-layer or the second portion of the n-layer on the first portion of the n-layer by the high-frequency plasma CVD process.

20. A method of forming a semiconductor element having a plurality of pin junctions comprised of a silicon-based material, the method comprising the steps of:

forming a first pin junction of the pin junctions;

forming a first portion of an n-layer or a first portion of a p-layer of a second pin junction adjacent to the first pin junction to form a pn interface;

exposing a surface of the first portion of the p-layer or the first portion of the n-layer to an oxygen-containing atmosphere; and forming a second portion of the p-layer on the first portion of the p-layer which was exposed to the oxygen-containing atmosphere or forming a second portion of the n-layer on the first portion of the n-layer which was exposed to the oxygen-containing atmosphere;

wherein the plurality of pin junctions is formed on a substrate by a high-frequency plasma CVD process under a pressure of not more than atmospheric pressure.

* * * * *

UNITED STATES PATENT AND TRADEMARK OFFICE
CERTIFICATE OF CORRECTION

PATENT NO.     : 6,653,165 B2
DATED          : November 25, 2003
INVENTOR(S)    : Takaharu Kondo et al.

It is certified that error appears in the above-identified patent and that said Letters Patent is hereby corrected as shown below:

Column 6,
Line 55, "in side" should read -- inside --.

Column 9,
Line 11, "stack" should read -- stack- --.
Line 47, "much" should read -- a very --.

Column 11,
Line 15, "of components" should read -- of the components --.

Column 12,
Line 41, "the both" should read -- both --.

Column 15,
Line 19, "film the" should read -- film, the --.

Column 16,
Line 33, "platelike" should read -- plate-like --.

Column 17,
Line 17, "pipe" should read -- pipes --.

Column 18,
Line 19, "pipe" should read -- pipes --.

Column 22,
Lines 21-23, "Substrate          200ºC
                              temperature" should read
         -- Substrate          200ºC
              temperature --.

UNITED STATES PATENT AND TRADEMARK OFFICE
CERTIFICATE OF CORRECTION

PATENT NO.   : 6,653,165 B2
DATED        : November 25, 2003
INVENTOR(S)  : Takaharu Kondo et al.

It is certified that error appears in the above-identified patent and that said Letters Patent is hereby corrected as shown below:

Column 23,
Line 15, "an i-Layer" should read -- an i-layer --.

Column 24,
Line 26, "alter" should read -- after --.

Signed and Sealed this

Seventeenth Day of August, 2004

JON W. DUDAS
*Acting Director of the United States Patent and Trademark Office*